United States Patent
Lee et al.

(10) Patent No.: US 12,416,683 B2
(45) Date of Patent: Sep. 16, 2025

(54) SLAVE BMS FOR DIAGNOSING AN ERROR OF A BATTERY MODULE AND BATTERY PACK COMPRISING SAME SLAVE BMS

(71) Applicant: LG Energy Solution, Ltd., Seoul (KR)

(72) Inventors: Ye Seul Lee, Daejeon (KR); Hyun Ki Cho, Daejeon (KR)

(73) Assignee: LG Energy Solution, Ltd., Seoul (KR)

(*) Notice: Subject to any disclaimer, the term of this patent is extended or adjusted under 35 U.S.C. 154(b) by 597 days.

(21) Appl. No.: 17/801,924

(22) PCT Filed: May 28, 2021

(86) PCT No.: PCT/KR2021/006645
§ 371 (c)(1),
(2) Date: Aug. 24, 2022

(87) PCT Pub. No.: WO2021/256722
PCT Pub. Date: Dec. 23, 2021

(65) Prior Publication Data
US 2023/0101736 A1 Mar. 30, 2023

(30) Foreign Application Priority Data
Jun. 19, 2020 (KR) .................... 10-2020-0074768

(51) Int. Cl.
*G01R 31/396* (2019.01)
*H01M 10/42* (2006.01)
*H02J 7/00* (2006.01)

(52) U.S. Cl.
CPC ........ *G01R 31/396* (2019.01); *H01M 10/425* (2013.01); *H02J 7/0047* (2013.01);
(Continued)

(58) Field of Classification Search
CPC ....... H01M 10/425; H01M 2010/4271; H01M 2010/4278; H01M 2010/4207;
(Continued)

(56) References Cited

U.S. PATENT DOCUMENTS

2010/0116570 A1* 5/2010 Sugawara ............. H01M 50/35
429/82
2013/0271072 A1* 10/2013 Lee ................... H01M 10/4207
320/108
(Continued)

FOREIGN PATENT DOCUMENTS

CN 103718425 A 4/2014
CN 103723051 A 4/2014
(Continued)

OTHER PUBLICATIONS

International Search Report for Application No. PCT/KR2021/006645 mailed Sep. 6, 2021, pp. 1-3.

*Primary Examiner* — David V Henze-Gongola
(74) *Attorney, Agent, or Firm* — Lerner David LLP (57) ABSTRACT

A battery pack comprising a slave BMS which diagnoses an error in a battery module. The battery pack includes a master BMS and a first slave BMS. The first slave BMS, when an error has occurred in a first battery module, determines whether or not the error is critical. The first slave BMS communicates with the master BMS in a time segment corresponding to the Identification (ID) of the first slave BMS, changes the ID based on whether or not the error is critical, then outputs information on the error to the master BMS in a time segment corresponding to the changed ID.

15 Claims, 10 Drawing Sheets

(52) U.S. Cl.
CPC ............... *H01M 2010/4271* (2013.01); *H01M 2010/4278* (2013.01)

(58) Field of Classification Search
CPC ......... H01M 2010/4221; G01R 31/396; H04Q 9/00; H04Q 2209/10; G08C 25/00; H02J 7/0047
See application file for complete search history.

(56) References Cited

U.S. PATENT DOCUMENTS

| | | |
|---|---|---|
| 2014/0091770 A1 | 4/2014 | Lee et al. |
| 2015/0244191 A1 | 8/2015 | Matsumura et al. |
| 2016/0325626 A1 | 11/2016 | Honda et al. |
| 2019/0237816 A1* | 8/2019 | Kim .................... H01M 10/482 |

FOREIGN PATENT DOCUMENTS

| | | |
|---|---|---|
| JP | 2002269661 A | 9/2002 |
| JP | 5421942 B2 | 2/2014 |
| JP | 5693547 B2 | 4/2015 |
| JP | 2015156319 A | 8/2015 |
| JP | WO2015121979 A1 | 3/2017 |
| JP | 2018010441 A | 1/2018 |
| KR | 20130095424 A | 8/2013 |
| KR | 20140084453 A | 7/2014 |
| KR | 101539689 B1 | 7/2015 |
| KR | 20170116377 A | 10/2017 |
| KR | 20180079769 A | 7/2018 |
| KR | 101926196 B1 | 12/2018 |
| KR | 20190037882 A | 4/2019 |
| KR | 20200068065 A | 6/2020 |

\* cited by examiner

SLAVE BMS FOR DIAGNOSING AN ERROR OF A BATTERY MODULE AND BATTERY PACK COMPRISING SAME SLAVE BMS

CROSS-REFERENCE TO RELATED APPLICATIONS

The present application is a national phase entry under 35 U.S.C. § 371 of International Application No. PCT/KR2021/006645 filed May 28, 2021, which claims priority from Korean Patent Application No. 10-2020-0074768 filed on Jun. 19, 2020, all of which are incorporated herein by reference.

Technical Field

The present invention relates to a battery pack. More specifically, the present invention relates to a battery pack which changes an operating mode depending on whether or not an error occurring in a battery module is critical.

Background Art

In recent years, there has been active research and development into secondary batteries. Here, a secondary battery is a battery capable of charging and discharging, and includes all of conventional Ni/Cd batteries, Ni/MH batteries, etc., and the more recent lithium ion batteries. Among secondary batteries, lithium ion batteries have an advantage in that they have much higher energy density compared to conventional Ni/Cd batteries and Ni/MH batteries, etc. Lithium ion batteries can be made with light weight and a small form factor, and are used as electrical power sources for mobile devices. In particular, lithium ion batteries can be used as an electrical power source for electric vehicles, and are receiving attention as a next-generation energy storage medium.

Secondary batteries are generally use in battery module units where in a plurality of battery cells are connected serially and/or in parallel. A battery pack comprises a plurality of slave BMS (Battery Management Systems), and a master BMS which manages the plurality of plurality of slave BMS. The slave BMS monitor the battery modules, and notify the master BMS of information relating to errors occurring in the battery modules The respective slave BMS may communicate with the master BMS during allocated times. However, in this case, there is the problem that even in a situation where an error occurring in a battery module is critical, a slave BMS is unable to promptly transmit information on the error to the master BMS.

SUMMARY

Technical Problem

The purpose of the present invention, which has been devised to solve the above-stated technical problem, is to provide a slave BMS which determines a time for transmitting error information to a master BMS depending on the type of an error occurring in a battery module.

Technical Solution

The battery pack according to an embodiment of the present invention may include a master battery management system (BMS) and a first slave BMS. The first slave BMS may be configured to monitor a first battery module and, in response to an error in a first battery module, determine whether or not the error is critical. The first slave BMS may be configured to communicate with the master BMS in a first time segment corresponding to a first identification (ID) of the first slave BMS, change the first ID to a second ID, wherein a timing of the change is based on whether or not the error is critical, and after the first ID is changed to the second ID, output information on the error to the master BMS in a second time segment corresponding to the second ID.

The first slave BMS configured to communicate with the master BMS in a time segment corresponding to an identification (ID) of the first slave BMS may comprise a controller configured to, in response to an error in a battery module, determine whether or not the error is critical, and if the error is determined to be critical, change the first ID to a second ID. A first time segment may correspond to the first ID and may after a second time segment corresponding to the second ID, and after occurrence of the error. The first slave BMS may be configured to, after the first ID is changed to the second ID, output information on the error to the master BMS during the second time segment.

Advantageous Effects

The slave BMS according to the present invention is able to change its ID depending on the type of an error occurring in battery module. The slave BMS, by changing its ID, is able to output information on an error in a time segment earlier than the time segment originally allocated to the ID. Accordingly, the master BMS is able to promptly receive information on a critical error.

DETAILED DESCRIPTION

In the following, various embodiments of the present invention will be described in detail with reference to the attached drawings. In the present document, like reference signs are used to refer to like elements in the drawings, and redundant description of like elements will be omitted.

With regard to the various embodiments of the present invention disclosed in the present document, specific structural or functional descriptions are exemplified solely for the purpose of describing embodiments of the present invention. The various embodiments of the present invention may be carried out in various forms, and shall not be interpreted as being limited to the embodiments described in the present document.

Expressions such as "first" or "second" used in the various embodiments may describe various component elements without regard for order and/or importance, and do not limit such component elements. For example, without departing from the scope of the present invention, a first component element may be designated as a second component element, and similarly a second component element may also instead be designated as a first component element.

The terms used in the present invention are used only to describe specific embodiments, and may not be intended to limit the scope of other embodiments. Singular expressions, unless clearly intended otherwise by context, may also include plural expressions.

Including technical or scientific terms, all terms used herein may have the same meaning as that generally understood by a person having ordinary skill in the technical field of the present invention. Generally used, dictionary-defined terms may be interpreted as having identical or similar meaning as that which they have in the context of the relevant art, and unless clearly so defined in the present document, shall not be interpreted as having ideal or inordinately formal meanings. In no case may terms defined in the present document be interpreted in a manner that excludes the embodiments of the present invention.

Figure 1:
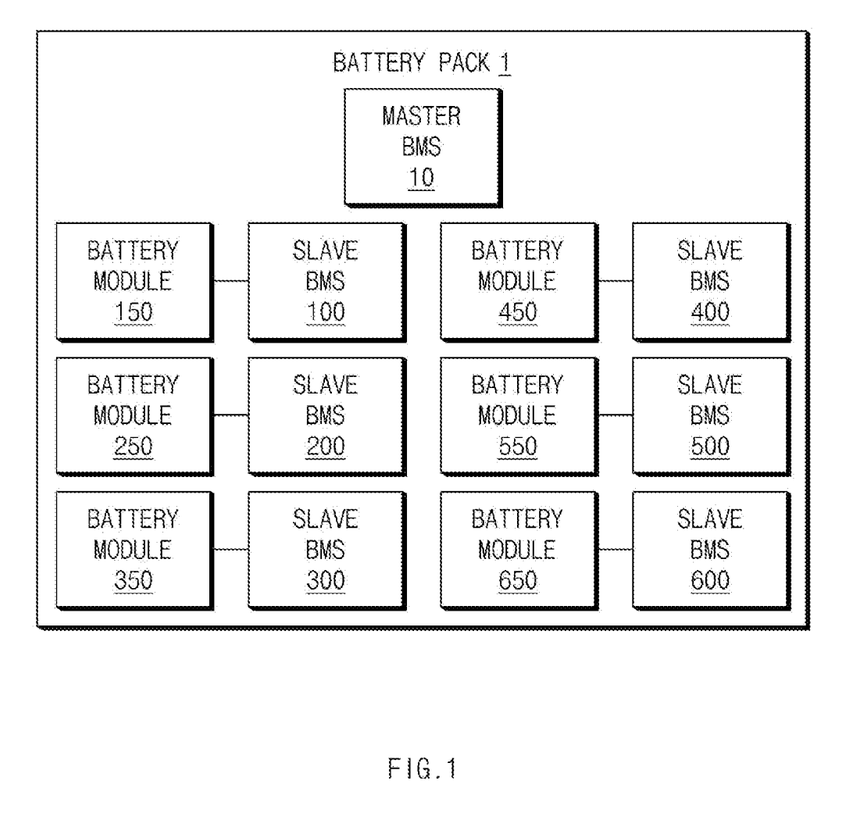
FIG. 1 is a block diagram illustrating a battery pack comprising the slave BMS according to an embodiment of the present invention.

FIG. 1 is a block diagram illustrating a battery pack comprising the slave BMS according to an embodiment of the present invention.

The battery pack 1 may comprise battery modules 150, 250, 350, 450, 550, 650, slave BMS 100, 200, 300, 400, 500, 600 and a master BMS 10. In the following description, the battery pack 1 is described as comprising six battery modules and six slave BMS, but the present invention is not limited hereto.

The respective battery modules 150, 250, 350, 450, 550, 650 may be comprised of battery cells connected serially and/or in parallel. The battery modules 150, 250, 350, 450, 550, 650 may supply electrical power to exterior circuits outside the battery pack 1.

The slave BMS 100, 200, 300, 400, 500, 600 may monitor their respective battery modules 150, 250, 350, 450, 550, 650. The slave BMS 100, 200, 300, 400, 500, 600 may each have a different Identifications (IDs). The IDs of the slave BMS 100, 200, 300, 400, 500, 600 may be allocated by the master BMS 10, but the present invention is not limited hereto. The slave BMS 100, 200, 300, 400, 500, 600 may communicate with the master BMS 10 in a time segment corresponding to their respective IDs. In the following description, in a case where the initial IDs of the slave BMS 100, 200, 300, 400, 500, 600 are not changed, it is assumed that the slave BMS 100, 200, 300, 400, 500, 600 communicate with the master BMS 10 sequentially. After communication between the slave BMS 600 and master BMS 10 is complete, the slave BMS 100 may again communicate with the master BMS 10. In the following, the operation of the slave BMS 300 and battery module 350 will be described in detail. The remaining slave BMS 100, 200, 400, 500, 600 provide operation which is substantially identical to that of the slave BMS 300, and the remaining battery modules 150, 250, 450, 550, 650 provide operation which is substantially identical to that of battery module 350.

The slave BMS 300 may detect an error which occurs in the battery module 350. The slave BMS 300 may output information on the detected error to the master BMS 10. The master BMS 10 may, based on information provided from the slave BMS 300, take appropriate action on the battery module 350. According to an embodiment of the present invention, in a case where the error occurring in the battery module 350 is critical, the master BMS 10 is able to promptly take action on the battery module 350.

The slave BMS 300 may detect whether or not an error which occurs in the battery module 350 is critical. In the following, "emergency error" refers to a critical error. "Emergency error" may refer to over voltage, under voltage, over temperature, over current, and the like. In the following, "common error" refers to an error which is not critical. "Common error" may refer to the battery module 350 having a low State of Charge (SOC), or some of the battery cells of the battery module 350 being inoperative. Provided, that the above classifications are meant to be exemplary and non-limiting, and an error may be classified as "emergency error" or "common error" using a standard different from the above classification.

In a case where it is determined that an emergency error has occurred in the battery module 350, the slave BMS 300 may, to output information more quickly on the error, changes its own ID. The slave BMS 300 may change its ID to the ID of another slave BMS. In this case, the time segment corresponding to the ID of the other slave BMS may be a time segment between the time when the error has occurred and the time segment corresponding to the initial ID of the slave BMS 300. For example, in a case where an emergency error has occurred in the battery module 350 while the slave BMS 100 is communicating with the master BMS 10, the slave BMS 300 may change its ID to the ID of slave BMS 100 or slave BMS 200. In another example, in a case where an emergency error has occurred in the battery module 350 while the slave BMS 500 is communicating with the master BMS 10, the slave BMS 300 may change its ID to the ID of one of the slave BMS 500, 600, 100, 200.

Particularly, the slave BMS 300 may change its ID to the ID of the slave BMS 100 which is communicating with the master BMS 10 at the time the error occurs. Accordingly, the slave BMS 300 is able to more quickly transmit information on the error to the master BMS 10.

In the time segment corresponding to the changed ID, the slave BMS 300 may transmit to the master BMS 10 a first notification signal which indicates that its ID has been changed. The master BMS 10 may, based on the first notification signal, output a second notification signal which indicates that the ID of the slave BMS 300 has been changed to the remaining slave BMS 100, 200, 400, 500, 600. The remaining slave BMS 100, 200, 400, 500, 600 may, based on the second notification signal, change their respective IDs so that communication with the master BMS 10 can take place unhindered. Here, the method by which the remaining slave BMS 100, 200, 400, 500, 600 change their IDs may follow a rule which has been input into the battery pack 1. For example, the rule may be for slave BMS 100 to change its ID to the initial ID of slave BMS 300 in a case where slave BMS 300 has changed its ID to the initial ID of slave BMS 100. In another example, in a case where slave BMS 300 has changed its ID to the initial ID of slave BMS 100, the rule may be for slave BMS 200 to change its ID to the initial ID of slave BMS 300, and for slave BMS 100 to change its ID to the initial ID of slave BMS 200. However, the present invention is not limited hereto, and various rules for adjusting the communication time segments of the slave BMS so that they do not overlap may be used.

The master BMS 10 may, in a case where information on an emergency error is received from the slave BMS 300, take appropriate action on the battery modules 150~650 and the slave BMS 100~600.

In a case where it is determined that an emergency error has occurred in the battery module 350, the slave BMS 300 may temporarily change its ID to the ID of the slave BMS that is communicating with the master BMS 10. After changing its ID, the slave BMS 300 may output to the master BMS 10 a notification signal which indicates that a common error has occurred. The time taken for the notification signal to be output may be shorter than the time taken for outputting information on the error. The slave BMS 300 may, after having output the notification signal, change its changed ID back to the initial ID. Therefore, in a case where a common error has occurred, unlike in a case where an emergency error has occurred, the remaining slave BMS 100, 200, 400, 500, 600 do not need to change their IDs. In the time segment corresponding to the changed ID, the slave BMS 300 may transmit to the master BMS 10 information on the common error.

Based on the notification signal, the master BMS 10 may become aware that a common error has occurred in the battery module 350. The master BMS 10 may, in a case where information on an emergency error is received from the slave BMS 300, take appropriate action on the battery modules 150~650 and the slave BMS 100~600. Provided, that the master BMS 10 may, when necessary, take appropriate action on the battery modules 150~650 and the slave BMS 100~600 even before information on a common error has been received.

Figure 2:
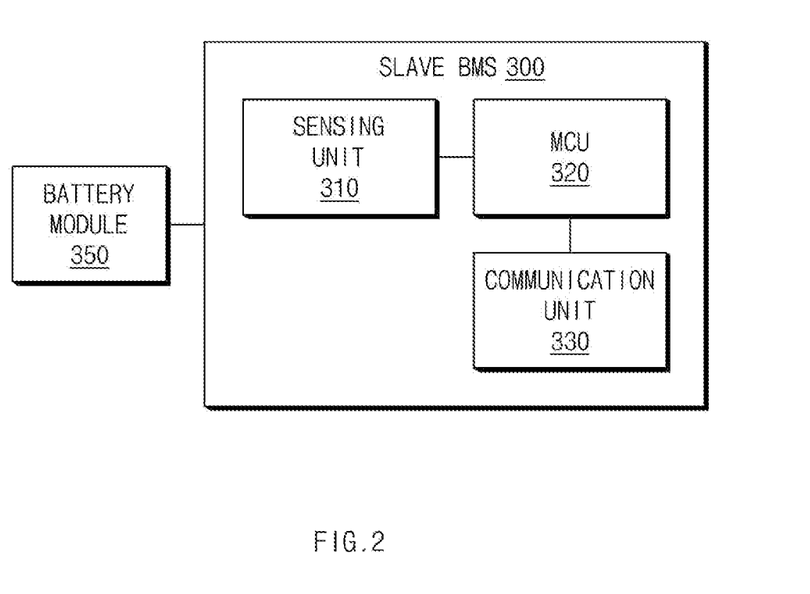
FIG. 2 is a block diagram illustrating the elements of the slave BMS of FIG. 1.

FIG. 2 is a block diagram illustrating the elements of the slave BMS 300 of FIG. 1.

As mentioned in the foregoing, as the remaining slave BMS 100, 200, 400, 500, 600 have configurations substantially identical to that of slave BMS 300, description of the remaining slave BMS 100, 200, 400, 500, 600 will be omitted.

The slave BMS 300 may comprise a sensing unit 310, an Micro Controller Unit (MCU), 320, and a communication unit 330.

The sensing unit 310 may acquire from the battery module 350 status data on the status of the battery module 350. For example, the sensing unit 310 may measure the voltage, current, temperature and the like of the battery module 350.

The MCU 320 may receive status data of the battery module 350 from the sensing unit 310. The MCU 320 may, based on the status data, detect an error that has occurred in the battery module 350. The MCU 320 may, based on the status data, determine whether the error that has occurred in the battery module 350 is an emergency error or a common error. The MCU 320 may, depending on the type of error that has occurred in the battery module 350, determine a timing for changing the ID of the slave BMS 300. The MCU 320 may control the communication unit 330 so that the communication unit 330 can output information on the error in a time segment corresponding to the changed ID. The method by which the MCU 320 changes the ID of the slave BMS 300 will be described in detail with reference to FIG. 3 through FIG. 9.

The communication unit 330 may, controlled by the MCU 320, output information on the error to the master BMS 10 of FIG. 1 during a time segment corresponding to the ID of the slave BMS 300.

As described with reference to FIG. 1 and FIG. 2, the slave BMS 300 of the present invention may change its ID depending on the type of error which has occurred in a battery module. The slave BMS 300, by changing its ID, is able to output information on an error in a time segment earlier than the time segment originally allocated to its initial ID. Accordingly, the master BMS 10 is able to promptly receive information on an error that has occurred in a battery module 350.

Figure 3:
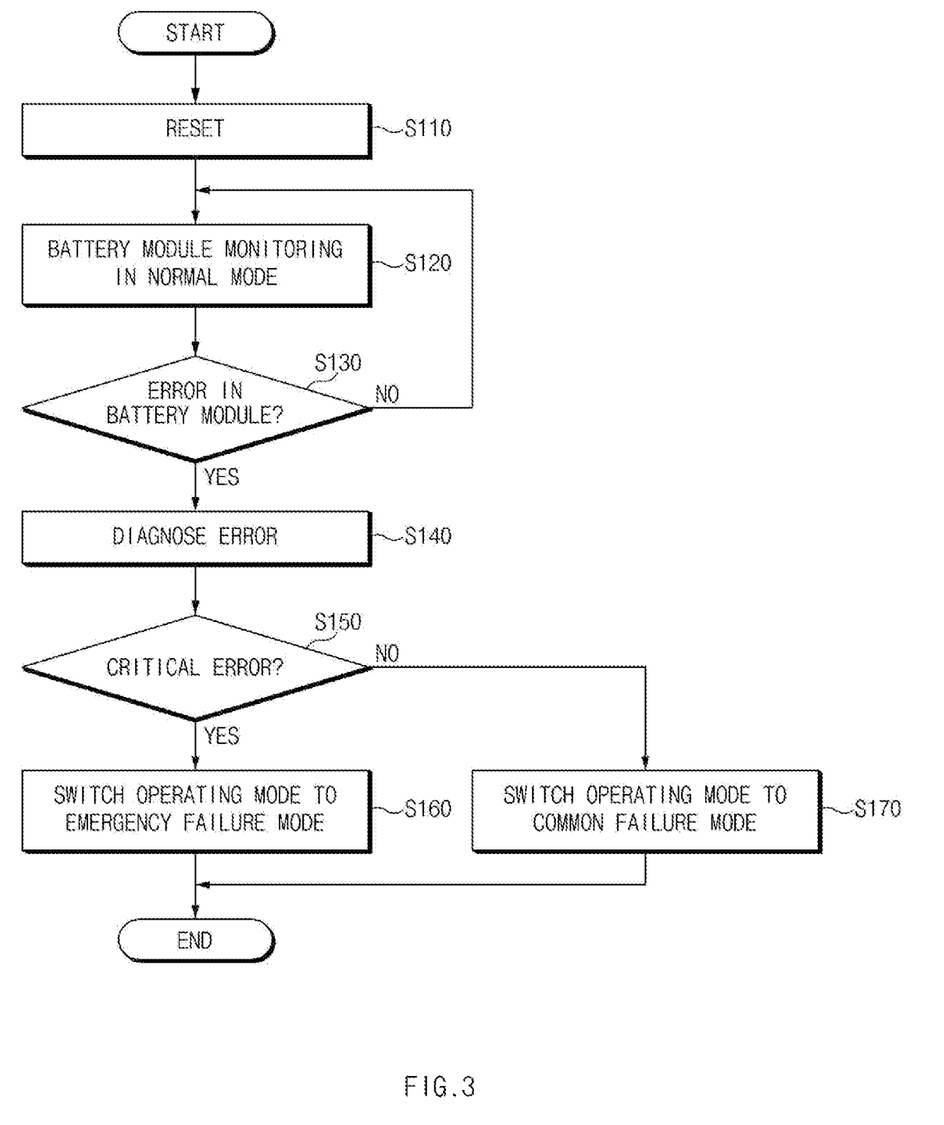
FIG. 3 is a flow diagram for describing the operation of the slave BMS of FIG. 2.

FIG. 3 is a flow diagram for describing the operation of the slave BMS of FIG. 2.

In Step S110, the slave BMS 300 may be reset by a user, or may be reset by control of the master BMS 10.

In Step S120, immediately after reset, the slave BMS 300 may operate in normal mode. The slave BMS 300 may monitor the battery module 350 in normal mode. The slave BMS 300 may acquire status data on the battery module 350. The operation of the slave BMS 300 in normal mode will be described in detail with reference to FIG. 4.

In Step S130, the slave BMS 300 may, based on the status data, determine whether or not an error has occurred in the battery module 350.

In a case where an error has not occurred, step S120 is carried out again.

In a case where an error has occurred, step S140 is carried out. In step S140, the slave BMS 300 may diagnose the error that has occurred in the battery module 350.

In step S150, the slave BMS 300 may determine whether or not the error that has occurred in the battery module 350 is critical.

In a case where the error is critical, step S160 is carried out. In step S160, the slave BMS 300 may switch operating modes from normal mode to emergency failure mode. The operation of the slave BMS 300 in emergency failure mode will be described in detail with reference to FIG. 5 through FIG. 8.

In a case where the error is not critical, step S170 is carried out. In step S170, the slave BMS 300 may switch operating modes from normal mode to common failure mode. The operation of the slave BMS 300 in common failure mode will be described in detail with reference to FIG. 9.

Figure 4:
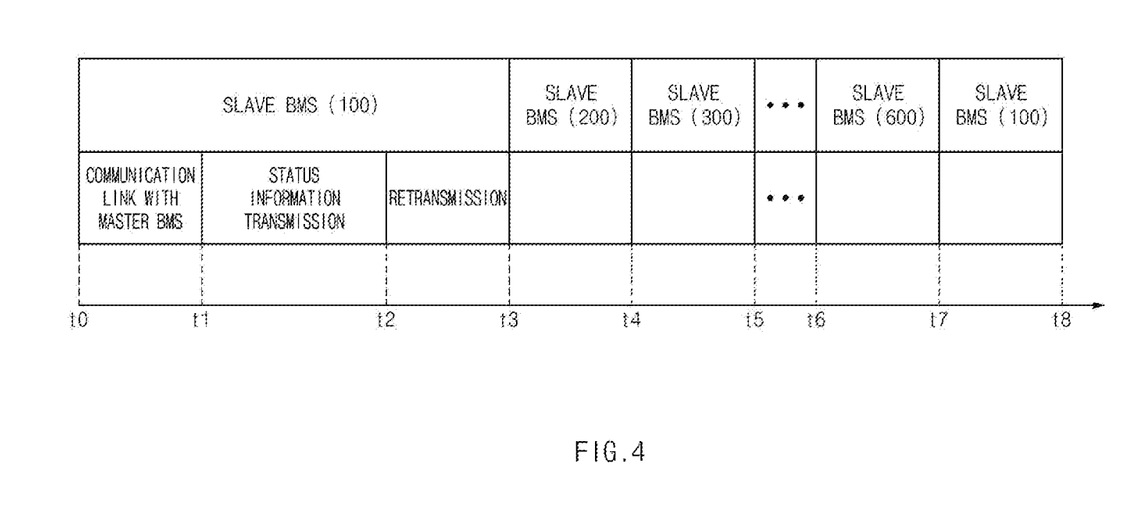
FIG. 4 is a conceptual diagram for describing the operation of the slave BMS of FIG. 1 in normal mode.

FIG. 4 is a conceptual diagram for describing the operation of the slave BMS of FIG. 1 in normal mode.

As described with reference to FIG. 1, the slave BMS 100, 200, 300, 400, 500, 600 may communicate with the master BMS 10 in a time segment corresponding to their respective IDs. In a case where the initial IDs of the slave BMS 100, 200, 300, 400, 500, 600 are not changed, it is assumed that the slave BMS 100, 200, 300, 400, 500, 600 communicate with the master BMS 10 sequentially. In normal mode, the slave BMS 300 may not change its ID. Accordingly, the slave BMS 300 may communicate with the master BMS 10 in the time segment t4~t5 allocated to the initial ID. After communication between the slave BMS 600 and master BMS 10 is complete, the slave BMS 100 may again communicate with the master BMS 10.

In the following, the methods by which the respective slave BMS 100, 200, 300, 400, 500, 600 communicate with the master BMS 10 will be described in detail. The slave BMS 100 may communicate with the master BMS 10 in the time segment t0~t3. The time segment t0~t3 may include a ready segment t0~t1, an information transmission segment t1~t2 and a retransmission segment t2~t3.

The ready segment t0~t1 may be a segment wherein the slave BMS 100 begins communication with the master BMS 10 to output status data on the battery module 150 to the master BMS 10. In the ready segment t0~t1, the slave BMS 100 may transmit a ready signal to the master BMS 10. Based on the ready signal, the master BMS 10 may prepare to receive status data from the slave BMS 100.

The information transmission segment t1~t2 may be a segment where the slave BMS 100 outputs status data on the battery module 150 to the master BMS 10. The status data on the battery module 150 may include data on an error that has occurred in the battery module 150.

The retransmission segment t2~t3 may be a segment where the slave BMS 100 retransmits status data on the battery module 150 to the master BMS 10. The slave BMS 100, for more certain delivery of status data on the battery module 150 to the master BMS 10, retransmit the status data in the retransmission segment t2~t3. Provided, that the status data output in the retransmission segment t2~t3 may be data wherein some information has been omitted from the status data output in the information transmission segment t1~t2. That is, the retransmission segment t2~t3 maybe shorter than the information transmission segment t1~t2.

The other slave BMS 200, 300, 400, 500, 600 may respectively communicate with the master BMS 10 using the same method as that of slave BMS 100. That is, whereas omitted from FIG. 4, the time segments corresponding to the other slave BMS 200, 300, 400, 500, 600 may also respectively comprise a ready segment, information transmission segment, and retransmission segment.

Figure 5:
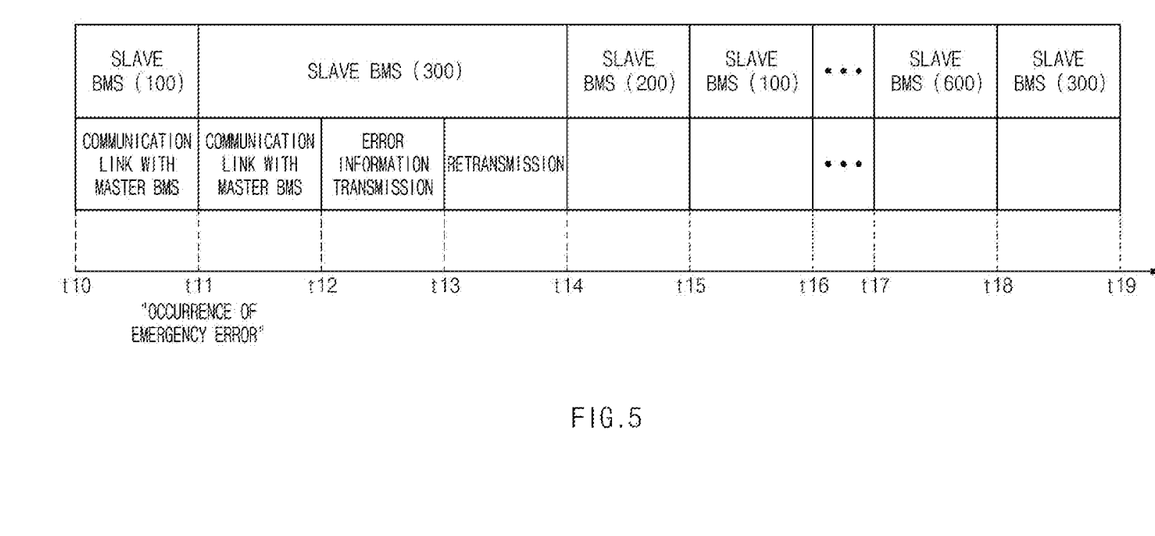
FIG. 5 is a conceptual diagram for describing one embodiment of the operation of the slave BMS of FIG. 1 in an emergency failure mode.

FIG. 5 is a conceptual diagram for describing one embodiment of the operation of the slave BMS of FIG. 1 in an emergency failure mode.

In the description making reference to FIG. 5, it is assumed that at time 't11', an emergency error has occurred in the battery module 350. Time 't11' may correspond to time 't1' in FIG. 1. Further, in a case where the initial IDs of the slave BMS 100, 200, 300, 400, 500, 600 are not changed, it is assumed that the slave BMS 100, 200, 300, 400, 500, 600 communicate with the master BMS 10 sequentially.

In a case where it is determined that an emergency error has occurred in the battery module 350, the slave BMS 300 may output information on the emergency error to the master BMS 10. Here, the slave BMS 300 may output information on the emergency error at an earlier time segment t11~t14 than the time segment t15~t16 corresponding to its initial ID. The slave BMS 300 may, to output information on the emergency error in the time segment t11~t14, change its initial ID to the initial ID of slave BMS 100. The slave BMS 100 may be the slave BMS which is communicating with the master BMS 10 at the time 't11' when the emergency error occurs. The time segment t10~t14 may be a time segment corresponding to the initial ID of the slave BMS 100, and may correspond to the time segment t0~t3 of FIG. 4.

In the information transmission segment t12~t13, the slave BMS 300 may output information on the emergency error to the master BMS 10. In the information transmission segment t12~t13, the slave BMS 300 may output to the master BMS 10 a first notification signal which indicates that its ID has been changed to the initial ID of slave BMS 100.

The master BMS 10 may, based on the first notification signal, output to the remaining slave BMS 100, 200, 400, 500, 600 a second notification signal which indicates that the ID of slave BMS 300 has been changed to the initial ID of slave BMS 100. The remaining slave BMS 100, 200, 400, 500, 600 may, based on the second notification signal, change their respective IDs in accordance with a prescribed rule. In a case where, due to slave BMS 300, slave BMS 100 has not been able to transmit status data on battery module 150 to the master BMS 10, slave BMS 100 may output status data on the battery module 150 to the master BMS 10 once communication between slave BMS 300 and the master BMS 10 has been completed. In this case, for example, slave BMS 100 may change its ID to the initial ID of slave BMS 300. Accordingly, as illustrated in FIG. 5, in the time segment t15~t16 allocated to the initial ID of slave BMS 300, slave BMS 100 may transmit status data on the battery module 150 to the master BMS 10. In this case, the order in which the slave BMS 100, 200, 300, 400, 500, 600 communicate with the master BMS 10 may be 300→200→100→400→500→600. However, the present invention is not limited hereto, and the remaining slave BMS 100, 200, 400, 500, 600 may change their IDs in various ways to reconstitute the order in which they communicate with the master BMS 10. Various embodiments are described with reference to FIG. 6 and FIG. 7.

Figure 6:
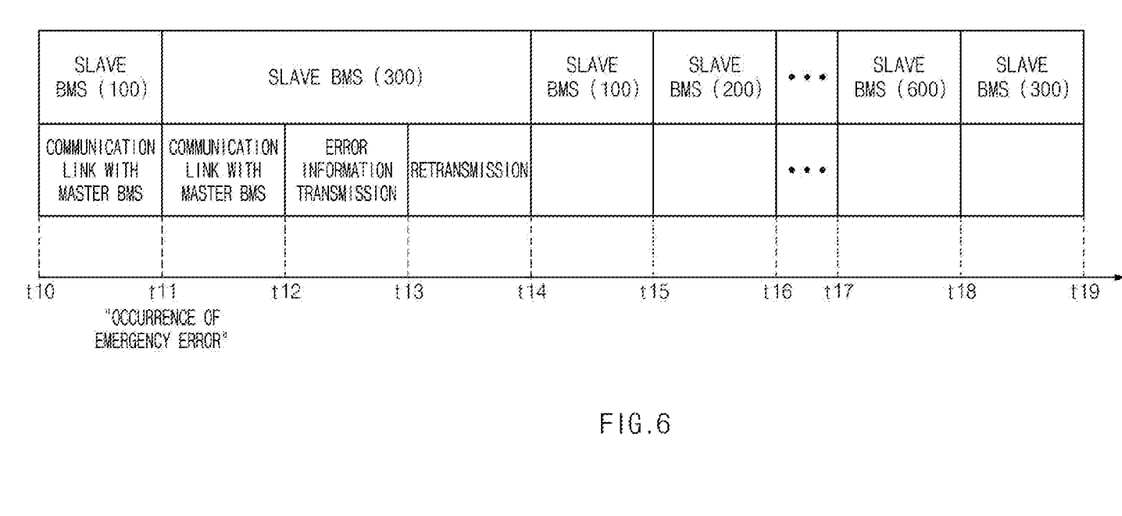
FIG. 6 is a conceptual diagram for describing another embodiment of the operation of the slave BMS of FIG. 1 in an emergency failure mode.

FIG. 6 is a conceptual diagram for describing another embodiment of the operation of the slave BMS of FIG. 1 in an emergency failure mode. For convenience of description, FIG. 5 will also be referenced.

The times t10~t19 marked in FIG. 6 correspond to the times t10~t19 marked in FIG. 5. Referring the FIG. 6, a method different from the method explained with reference to FIG. 5 wherein the remaining slave BMS 100, 200, 400, 500, 600 change their respective Ids is explained, and redundant explanation will be omitted.

When the ID of the slave BMS 300 where an emergency error has occurred is changed, the remaining slave BMS 100, 200, 400, 500, 600 may change their respective IDs so that the original order in which the slave BMS 100, 200, 400, 500, 600 and the master BMS 10 communicate is not changed. In this case, the order in which the slave BMS 100, 200, 300, 400, 500, 600 communicate with the master BMS 10 may be 300→100→200→400→500→600.

As an embodiment, a method by which slave BMS 200 among the remaining slave BMS 100, 200, 400, 500, 600 changes its ID will be described. The slave BMS 200 may change its ID to the initial ID of the slave BMS 300. The time segment to which the initial ID of the slave BMS 300 corresponds t15~t16 of FIG. 5 may be a time segment immediately after the time segment to which the initial ID of slave BMS 200 corresponds t14~t15 of FIG. 5.

Figure 7:
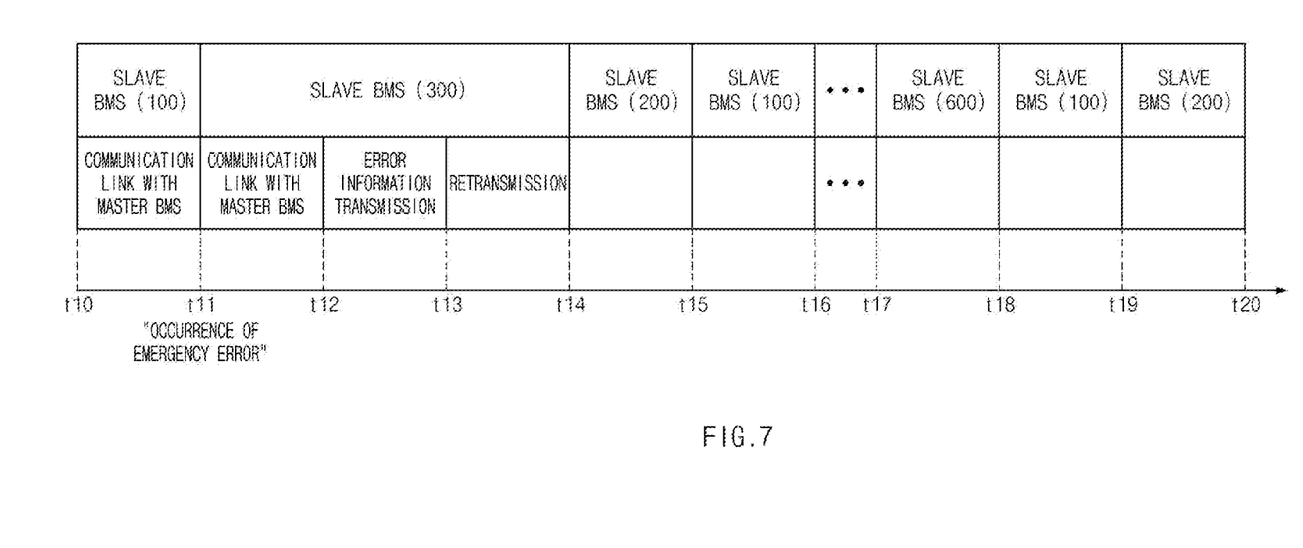
FIG. 7 is a conceptual diagram for describing another embodiment of the operation of the slave BMS of FIG. 1 in an emergency failure mode.

FIG. 7 is a conceptual diagram for describing another embodiment of the operation of the slave BMS of FIG. 1 in an emergency failure mode. For convenience of description, FIG. 5 will also be referenced.

The times t10~t19 marked in FIG. 7 correspond to the times t10~t19 marked in FIG. 5. With reference to FIG. 7, a method wherein the remaining slaves 100, 200, 400, 500, 600 change their ID to their initial ID after one cycle is completed that is, after time 't18'.

In this case, in a cycle t10~t18 wherein an emergency error has occurred, the slave BMS 100, 200, 400, 500, 600 may change their respective IDs in a method identical to that explained with reference to FIG. 5. However, the present invention is not limited hereto, and in a cycle t10~t18 wherein an emergency error has occurred, the slave BMS 100, 200, 400, 500, 600 may change their respective IDs in a method identical to that explained with reference to FIG. 6. When a cycle wherein an emergency error has occurred t10~t18 is completed, the slave BMS 100, 200, 300, 400, 500, 600 may change their ID back to their initial ID. In this case, the order in which the slave BMS 100, 200, 300, 400, 500, 600 communicate with the master BMS 10 may be 100→200→300→400→500→600.

Figure 8:
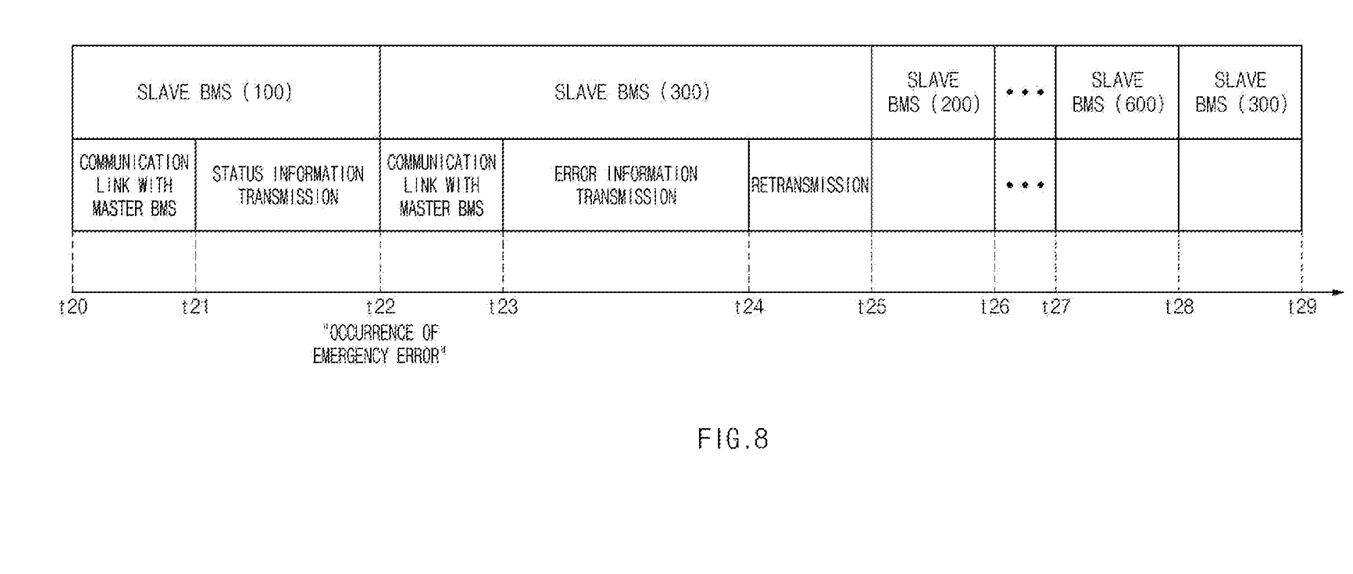
FIG. 8 is a conceptual diagram for describing another embodiment of the operation of the slave BMS of FIG. 1 in an emergency failure mode.

FIG. 8 is a conceptual diagram for describing another embodiment of the operation of the slave BMS of FIG. 1 in an emergency failure mode.

In the description making reference to FIG. 8, it is assumed that at time 't22', an emergency error has occurred in the battery module 350. Time 't22' may correspond to time 't2' in FIG. 1. Further, in a case where the initial IDs of the slave BMS 100, 200, 300, 400, 500, 600 are not changed, it is assumed that the slave BMS 100, 200, 300, 400, 500, 600 communicate with the master BMS 10 sequentially. FIG. 8 will be described with the primary focus on differences from the method described with reference to FIG. 5.

Unlike in FIG. 5, in FIG. 8, slave BMS 100 may transmit status data on battery module 150 to the master BMS 10 once before communication is interrupted by slave BMS 300. In this case, slave BMS 100 may not, after information transmission by slave BMS 300 has been completed, re-transmit status data on battery module 150 to the master BMS 10. That is, the slave BMS 100 may not change its ID to the initial ID of the slave BMS 300.

Figure 9:
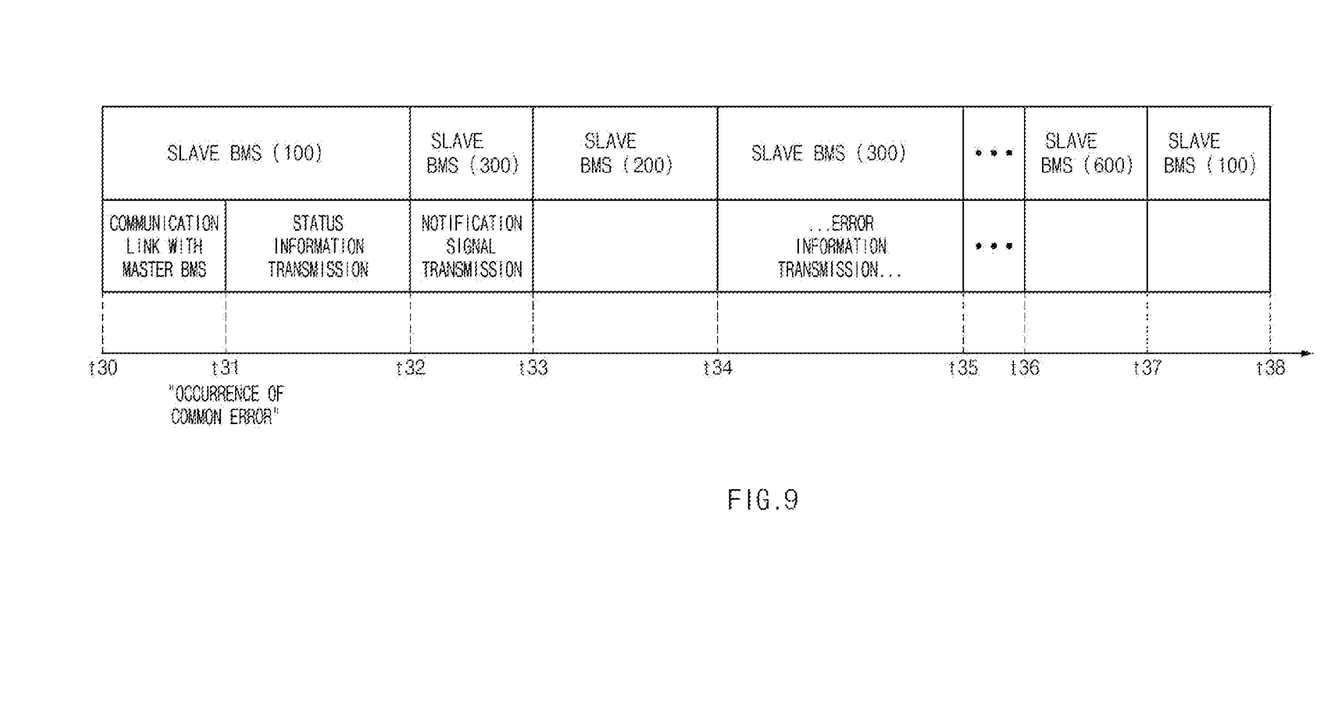
FIG. 9 is a conceptual diagram for describing one embodiment of the operation of the slave BMS of FIG. 1 in an emergency failure mode.

FIG. 9 is a conceptual diagram for describing one embodiment of the operation of the slave BMS of FIG. 1 in an emergency failure mode.

In the description making reference to FIG. 9, it is assumed that at time 't31', an emergency error has occurred in the battery module 350. Time 't31' may correspond to time 't1' in FIG. 1. Further, in a case where the initial IDs of the slave BMS 100, 200, 300, 400, 500, 600 are not changed, it is assumed that the slave BMS 100, 200, 300, 400, 500, 600 communicate with the master BMS 10 sequentially. FIG. 8 will be described with the primary focus on differences from the method described with reference to FIG. 5.

In a case where it is determined that an emergency error has occurred in the battery module 350, the slave BMS 300 may output a notification signal to the master BMS 10 to inform that an error has occurred in the battery module 350. Provided, that slave BMS 300 may, unlike in emergency failure mode, transmit the notification signal after status data on battery module 150 has been output once from the slave BMS 100 which is communicating with the master BMS 10. The notification signal may be output in time segment t32~t33, and time segment t32~t33 may correspond to time segment t2~t3 of FIG. 1. The time segment t32~t33 needed for output of the notification signal may be shorter than time segment t11~t14 of FIG. 5. Time segment t11~t14 may be a time segment necessary for output of information on an error.

Slave BMS 300 may change its ID to the initial ID of slave BMS 100 after slave BMS 100 has output status data on battery module 150 once (that is, after time 't32'). The slave BMS 300 may, after having output the notification signal (that is, after time 't33'), change its changed ID back to the initial ID. In the time segment corresponding to the changed ID t34~t35, the slave BMS 300 may transmit to the master BMS 10 information on the common error. Time segment t34~t35 may correspond to time segment t4~t5 in FIG. 4. Further, as slave BMS 300 changes its ID temporarily in common failure mode, the remaining slave BMS 100, 200, 400, 500, 600 may not change their ID.

Figure 10:
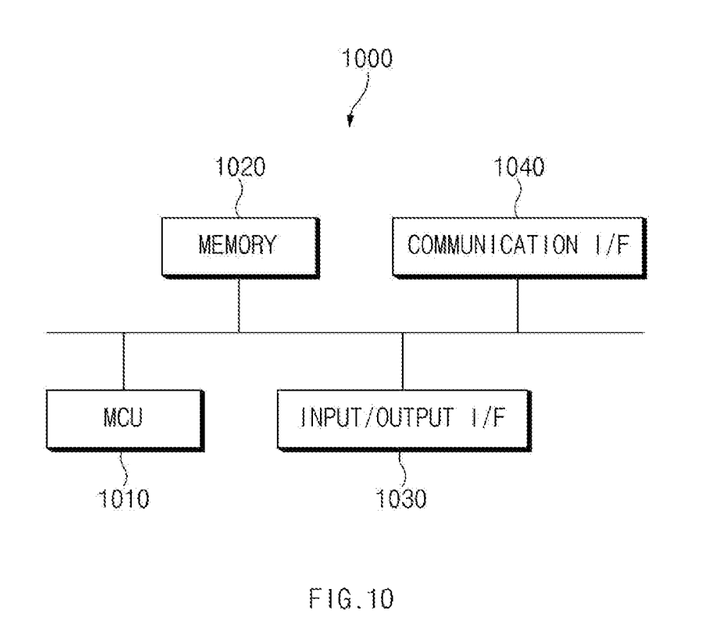
FIG. 10 is a drawing illustrating the hardware configuration of the BMS according to one embodiment of the present invention.

FIG. 10 is a drawing illustrating the hardware configuration of the BMS according to one embodiment of the present invention.

Referring to FIG. 10, the BMS 1000 may be comprised of a microcontroller (MCU) 810 which controls various processing and the respective elements; a memory 1020 on which an operating system program and various other programs (for example, a battery diagnostics program, a voltage approximation formula generating program, etc.) are recorded; an input/output interface 1030 which provides an input interface and output interface with the battery cell modules and/or semiconductor switching element; and a communicating interface 1040 which is capable of external communication through wired or wireless communication networks. In this manner, the computer program according to the present invention, by being recorded on a memory 1020 and being processed by a microcontroller 1010, can be implemented in the form of modules which carry out, for example, the respective functional blocks illustrated in FIG. 2.

Specific embodiments for carrying out the present invention have been described in the foregoing. The present invention includes not only the above-described embodiments, but also other embodiments which can be readily arrived at through simple design modifications. Further, the present invention also includes art which can be readily carried out in a modified form using the embodiments. Therefore, the scope of the present invention shall not be limited to the embodiments described above, and shall be defined not only by the appended claims but also their equivalents.

The invention claimed is:

1. A battery pack comprising:
   a master battery management system (BMS); and
   a first slave BMS configured to monitor a first battery module, wherein the first slave BMS is configured to:
   in response to an error in a first battery module, determine whether or not the error is critical;
   communicate with the master BMS in a first time segment corresponding to an ID a first identification (ID) of the first slave BMS;
   change the first ID to a second ID, wherein a timing of the change is based on whether or not the error is critical; and
   after the first ID is changed to the second ID, output information on the error to the master BMS in a second time segment corresponding to the second ID.

2. The battery pack of claim 1, further comprising a second slave BMS configured to monitor a second battery module, wherein the second ID corresponds to the second slave BMS, wherein the first time segment is after the second time segment, wherein the second time segment is after detection of the error in the first battery module, and wherein the first slave BMS is configured to: in response to the error being critical, change the first ID to the second ID.

3. The battery pack of claim 2, wherein:
   the first slave BMS is configured to select the second ID based on the second slave BMS being in communication with the master BMS.

4. The battery pack of claim 2, wherein:
   the master BMS is configured to output a notification signal to the second slave BMS in response to the ID of the first slave BMS being changed, and
   wherein the second slave BMS is configured to change the second ID based on the notification signal.

5. The battery pack of claim 4, wherein:
the second slave BMS is configured to change the second ID to the first ID based on the notification signal.

6. The battery pack of claim 5, wherein:
the second slave BMS is configured to:
   communicate with the master BMS during the first time segment; and
   after communicating with the master BMS during the first time segment, change the first ID of the second slave BMS back to the second ID, and
wherein the first slave BMS is configured to, after the second slave BMS communicates with the master BMS during the first time segment, change the second ID of the first slave BMS back to the first ID.

7. The battery pack of claim 5, wherein: the second slave BMS is configured to:
   communicate with the master BMS during the first time segment;
   after communicating with the master BMS during the first time segment, maintain the first ID of the second slave BMS, and
wherein the first slave BMS is configured to maintain the second ID of the first slave BMS.

8. The battery pack of claim 4, wherein:
the second slave BMS is configured to transmit a status information of the second battery module to the master BMS in a status information transmission segment;
after transmitting the status information to the master BMS, re-transmit the status information to the master BMS in a re-transmission segment;
in response to communication of the status information transmission segment with the master BMS being interrupted by the first slave BMS, transmit the status information of the second battery module after the first slave BMS outputs the information on the error to the master BMS, and
and in a case where, in the re-transmission segment, communication with the master BMS has been interrupted by the first slave BMS, the status information is not transmitted to the master BMS after the information on the error has been transmitted to the master BMS.

9. The battery pack of claim 2, further comprising a plurality of additional slave BMSs in communication with the master BMS,
   wherein: the master BMS is configured to, in response to the first ID of the first slave BMS being changed to the second ID, output a notification signal to each additional slave BMS having an ID corresponding to a time segment between the first time segment and a time of the error,
   wherein each of the plurality of additional slave BMSs having an ID corresponding to a time segment between the first time segment and a time of the error is configured to, based on the notification signal, change its respective ID.

10. The battery pack of claim 9, wherein the plurality of additional slave BMSs includes a third slave BMS having a third ID corresponding to a third time segment, wherein the third slave BMS is configured to:
based on the notification signal, change the third ID to a fourth ID corresponding to a fourth a time segment immediately after the third time segment.

11. The battery pack of claim 1,
further comprising a second slave BMS configured to monitor a second battery module, wherein the second ID corresponds to the second slave BMS, wherein the first time segment is after the second time segment, wherein the second time segment is after detection of the error in the first battery module, and wherein the first slave BMS is configured to, in response to the error not being critical, change the first ID of the first slave BMS to the second ID after status data on the second battery module is output from the second slave BMS to the master BMS.

12. The battery pack of claim 11, wherein: the first slave BMS is configured to:
   output a notification signal indicating the error during a retransmission segment within the second time segment, wherein the second slave BMS is configured to re-transmit the status data of the second battery module to the master BMS during the retransmission segment; and
   change from the second ID to the first ID after the notification signal is output; and
   output the information on the error during the first time segment.

13. A first slave BMS configured to communicate with a master BMS in a time segment corresponding to an identification (ID) of the first slave BMS, the first slave BMS comprising:
   a controller configured to, in response to an error in a battery module, determine whether or not the error is critical, and if the error is determined to be critical, change the first ID to a second ID, wherein the first time segment corresponds to the first ID and is after a second time segment corresponding to the second ID and after occurrence of the error, and
wherein the first slave BMS is configured to, after the first ID is changed to the second ID, output information on the error to the master BMS during the second time segment.

14. The first slave BMS of claim 13, wherein:
the second ID is assigned to a second slave BMS in communication with the master BMS during occurrence of the error.

15. The first slave BMS of claim 13, wherein:
the controller is configured to, in response to the error not being critical:
change the first ID to the second ID;
output a notification signal indicating the error during the second time segment;
change the second ID back to the first ID after outputting the notification signal; and
output the information on the error during the first time segment.

* * * * *